United States Patent
Kim et al.

(10) Patent No.: US 10,811,418 B2
(45) Date of Patent: Oct. 20, 2020

(54) DRAM CELL ARRAY USING FACING BAR AND METHOD OF FABRICATING THE SAME

(71) Applicant: DOSILICON CO., LTD., Shanghai (CN)

(72) Inventors: Jin Ho Kim, Hwaseong-si (KR); Tae Gyoung Kang, Yongin-si (KR)

(73) Assignee: DOSILICON CO., LTD., Shanghai (CN)

(*) Notice: Subject to any disclaimer, the term of this patent is extended or adjusted under 35 U.S.C. 154(b) by 0 days.

(21) Appl. No.: 15/950,378

(22) Filed: Apr. 11, 2018

(65) Prior Publication Data
US 2019/0237467 A1  Aug. 1, 2019

(30) Foreign Application Priority Data
Jan. 29, 2018 (KR) .................... 10-2018-0010391

(51) Int. Cl.
*H01L 27/108* (2006.01)
*H01L 49/02* (2006.01)

(52) U.S. Cl.
CPC .... *H01L 27/10805* (2013.01); *H01L 27/1085* (2013.01); *H01L 27/10814* (2013.01); *H01L 27/10852* (2013.01); *H01L 27/10855* (2013.01); *H01L 27/10873* (2013.01); *H01L 27/10885* (2013.01); *H01L 27/10888* (2013.01); *H01L 27/10891* (2013.01); *H01L 28/86* (2013.01); *H01L 28/90* (2013.01)

(58) Field of Classification Search
CPC ............... H01L 27/10876; H01L 27/10855
USPC ........................................................ 438/239
See application file for complete search history.

(56) References Cited

U.S. PATENT DOCUMENTS 8,536,642 B2    9/2013  Ogawa
2017/0330882 A1* 11/2017 Wang ................ H01L 27/10823

FOREIGN PATENT DOCUMENTS

KR         10-1287364      7/2013
KR     10-2014-0086647     7/2014

OTHER PUBLICATIONS

Machine translation of Rho, KR 10-2014-0086647, Jul. 8, 2014 (Year: 2014).*

* cited by examiner

*Primary Examiner* — Hsin Yi Hsieh
(74) *Attorney, Agent, or Firm* — Kile Park Reed & Houtteman PLLC

(57) ABSTRACT

A dynamic random access memory (DRAM) cell array using facing bars and a method of fabricating the DRAM cell array are disclosed. A first DRAM cell and a second DRAM cell of each of DRAM cell pairs of a DRAM cell array fabricated using a method of fabricating a DRAM cell array share a facing bar and a bit line plug therebetween. Thus, the overall layout area is greatly reduced by a DRAM cell array fabricated using the method of fabricating the DRAM cell array. Further, in the method of fabricating the DRAM cell array, a storage of each of the DRAM cells of the DRAM cell array is formed as a multi-fin type having a plurality of lateral protrusions, thereby greatly increasing an area of the storage.

4 Claims, 13 Drawing Sheets

DRAM CELL ARRAY USING FACING BAR AND METHOD OF FABRICATING THE SAME

CROSS-REFERENCE TO RELATED APPLICATION

This application claims priority to and the benefit of Korean Patent Application No. 10-2018-0010391, filed on Jan. 29, 2018, the disclosure of which is incorporated herein by reference in its entirety.

BACKGROUND

1. Field of the Invention

The present invention relates to a dynamic random access memory (DRAM) cell array and a method of fabricating the same, and more particularly, to a DRAM cell array using facing bars and a method of fabricating the DRAM cell array.

2. Discussion of Related Art

Generally, a dynamic random access memory (DRAM) is formed to include a plurality of DRAM cells. At this point, each of the plurality of DRAM cells is configured with a single cell transistor and a single storage. The storage is able to store charges, and the cell transistor forms a transmission channel for conducting between a bit line and the storage according to a voltage applied to a gate electrode.

Meanwhile, as DRAMs become highly integrated, research into DRAM cells capable of reducing layout areas is progressing. In particular, intensive research is being conducted into techniques for reducing layout area of cell transistor while obtaining certain lengths of transmission channels of the cell transistors.

One of the techniques for reducing the layout areas of the cell transistors is to implement cell transistors having vertical pillars. Thus, cell transistors having the vertical pillars may realize transmission channels having desired channel lengths even in limited layout areas.

However, in cell transistors having vertical pillars, since one pillar is required per DRAM cell, there is a limit on reducing a layout area of the DRAM cell.

Accordingly, DRAM cells capable of more effectively reducing layout areas thereof are needed.

SUMMARY OF THE INVENTION

The present invention is devised in consideration of the above-described needs, and is directed to a dynamic random access memory (DRAM) cell array configured to reduce overall layout area and a method of fabricating the DRAM cell array.

According to an aspect of the present invention, there is provided a dynamic random access memory (DRAM) cell array in which a plurality of DRAM cell pairs are arranged and each of the plurality of DRAM cell pairs comprises a first DRAM cell and a second DRAM cell, the DRAM cell array comprising: a facing bar configured to protrude with a predetermined width and height from a lateral surface of a semiconductor substrate and extend in a first direction that is a lateral direction, wherein the facing bar divides each of a plurality of active areas into a first sub-area and a second sub-area, the plurality of active areas are formed in a row in the first direction to correspond to the plurality of DRAM cell pairs, and the first and second DRAM cells of the corresponding DRAM cell pair is formed in first and second sub-areas; first and second word lines formed on both side surfaces of the facing bar and assigned to gate electrodes of cell transistors of the first and second DRAM cells of each of the plurality of DRAM cell pairs, wherein the cell transistors of the first and second DRAM cells of each of the plurality of DRAM cell pairs have transmission channels formed on the lateral surface of the semiconductor substrate and the side surfaces of the facing bar; a plurality of bit line plugs formed on the facing bar to correspond to the plurality of DRAM cell pairs, wherein each of the bit line plugs is electrically connected to a corresponding bit line and shared by junctions of one sides of the cell transistors of the first and second DRAM cells of the corresponding DRAM cell pair; and a plurality of pairs of storages formed to correspond to the plurality of DRAM cell pairs, wherein each of the pairs of storages comprises a first storage and a second storage, and the first and second storages are electrically connected to the first and second sub-areas and electrically connected to junctions of the other sides of the cell transistors of the first and second DRAM cells.

According to other aspect of the present invention, there is provided a method of fabricating a DRAM cell array in which a plurality of DRAM cell pairs are arranged, wherein each of the plurality of DRAM cell pairs includes first and second DRAM cells. The method includes an active forming operation of forming a plurality of active areas on a semiconductor substrate to be arranged in a row in a first direction, wherein the corresponding DRAM cell pair is disposed in each of the plurality of active areas; a facing bar forming operation of etching the semiconductor substrate, on which the plurality of active areas are formed, to form facing bars, wherein each of the facing bars extends in the first direction with a predetermined width and height on the semiconductor substrate, and divides each of the plurality of active areas into a first sub-area and a second sub-area; a gate electrode forming operation of forming a first word line and a second word line on both side surfaces of each of the facing bars and assigning the first and second word lines to gate electrodes of cell transistors of first and second DRAM cells of each of the plurality of DRAM cell pairs; a plug forming operation of forming bit line plugs corresponding to respective facing bars on the plurality of active areas and forming first and second storage plugs on the first and second sub-areas of each of the plurality of active areas, wherein each bit line plug is commonly connected to junctions of one sides of the respective cell transistors of the first and second DRAM cells of the corresponding DRAM cell pair, and the first and second storage plugs are electrically connected to junctions of the other sides of the respective cell transistors of the first and second DRAM cells of the corresponding DRAM cell pair; a bit line forming operation of forming a bit line to be electrically connected to the corresponding bit line plug, wherein the bit line extends in a second direction intersecting the first direction; and a storage forming operation of forming first and second storages to correspond to the first and second sub-areas, wherein the first and second storages are electrically connected to junctions of the other sides of the cell transistors of the corresponding first and second DRAM cells through the first and second storage plugs.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with the exemplary embodiments thereof, it will be apparent to those skilled in the art that various modifications can be made without departing from the spirit and scope of the invention.

Figure 1:
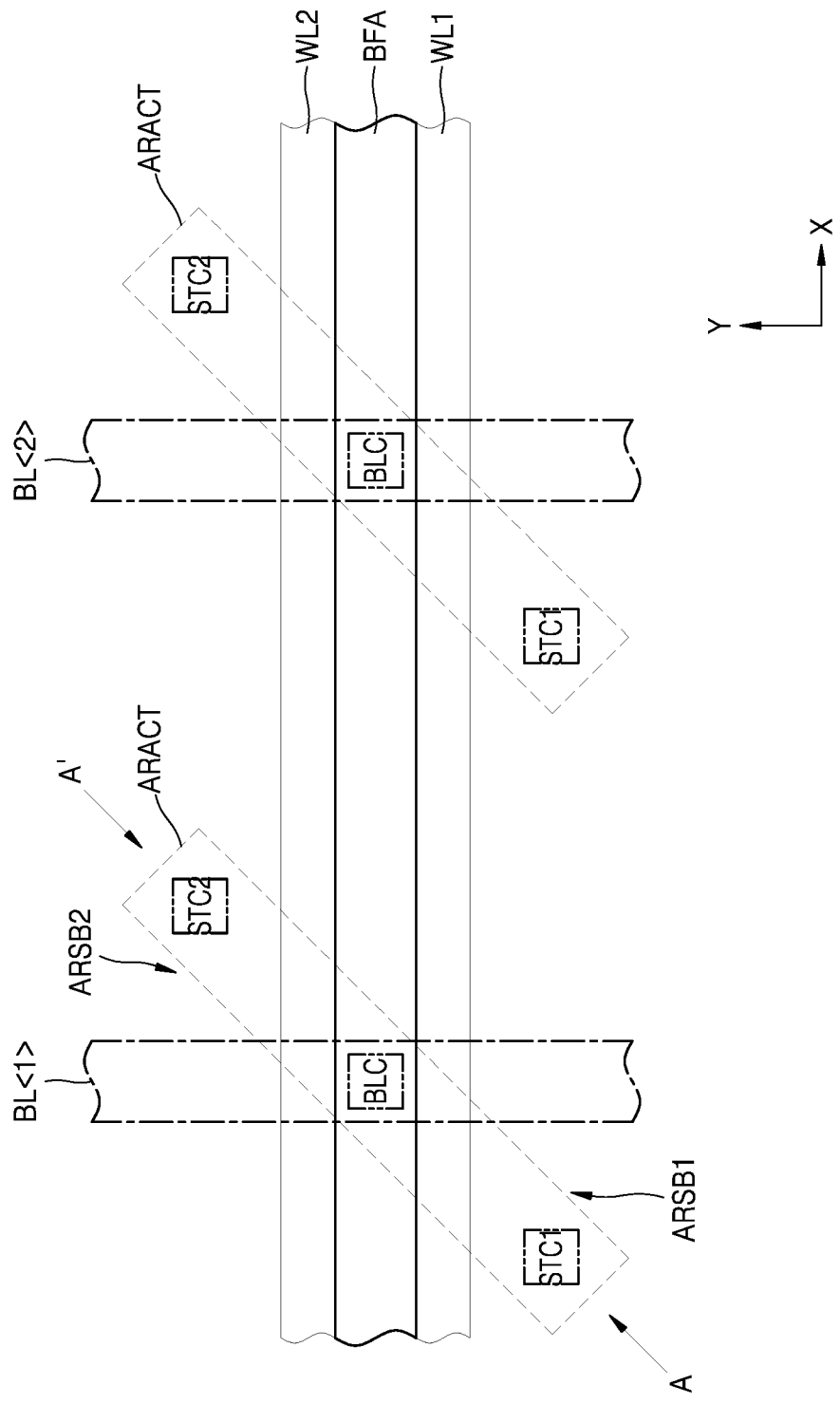
FIG. 1 is a layout diagram of a portion of a dynamic random access memory (DRAM) cell array according to an exemplary embodiment of the present invention.
Figure 2:
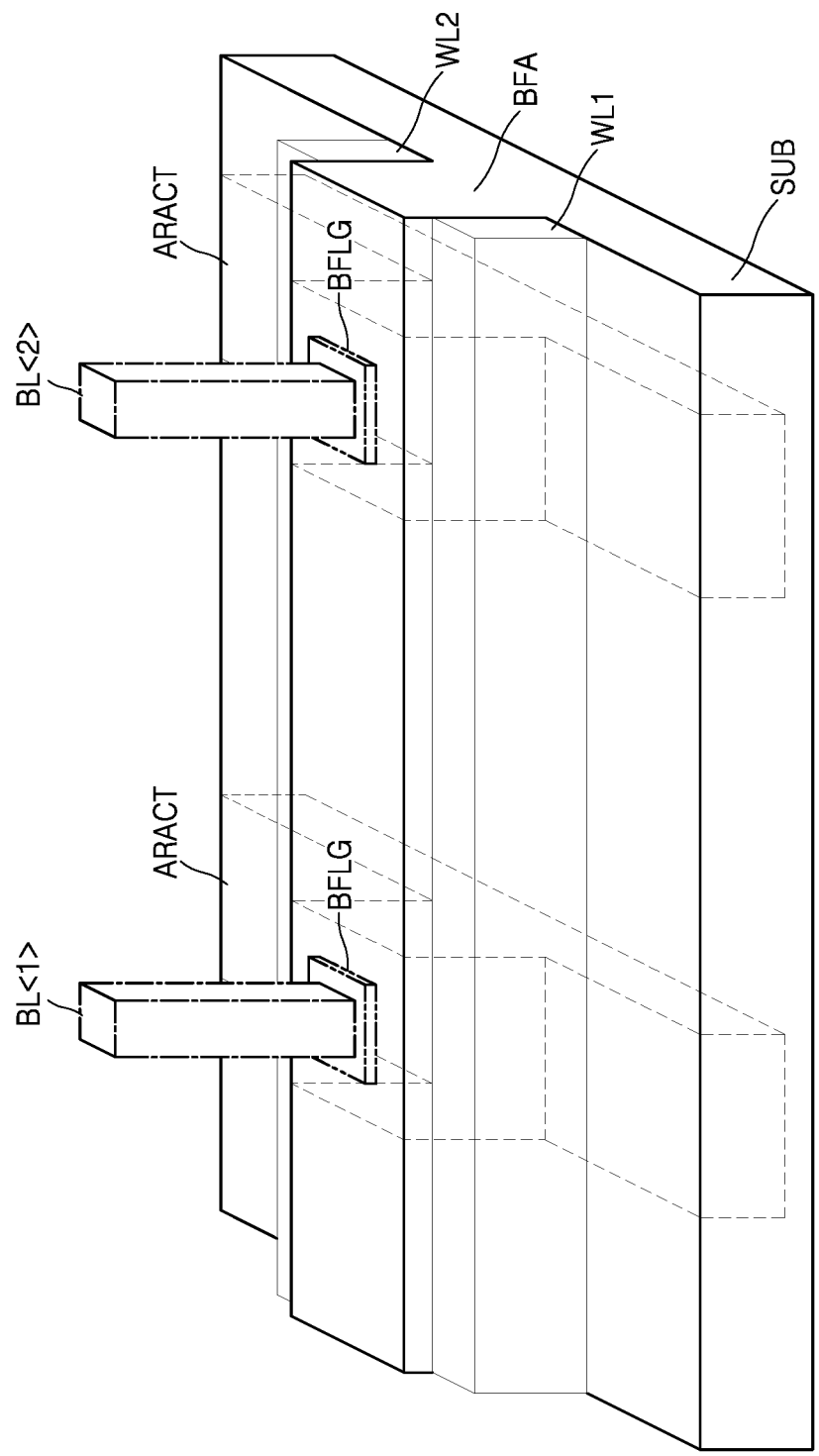
FIG. 2 is a perspective view of the DRAM cell array of FIG. 1.
Figure 3:
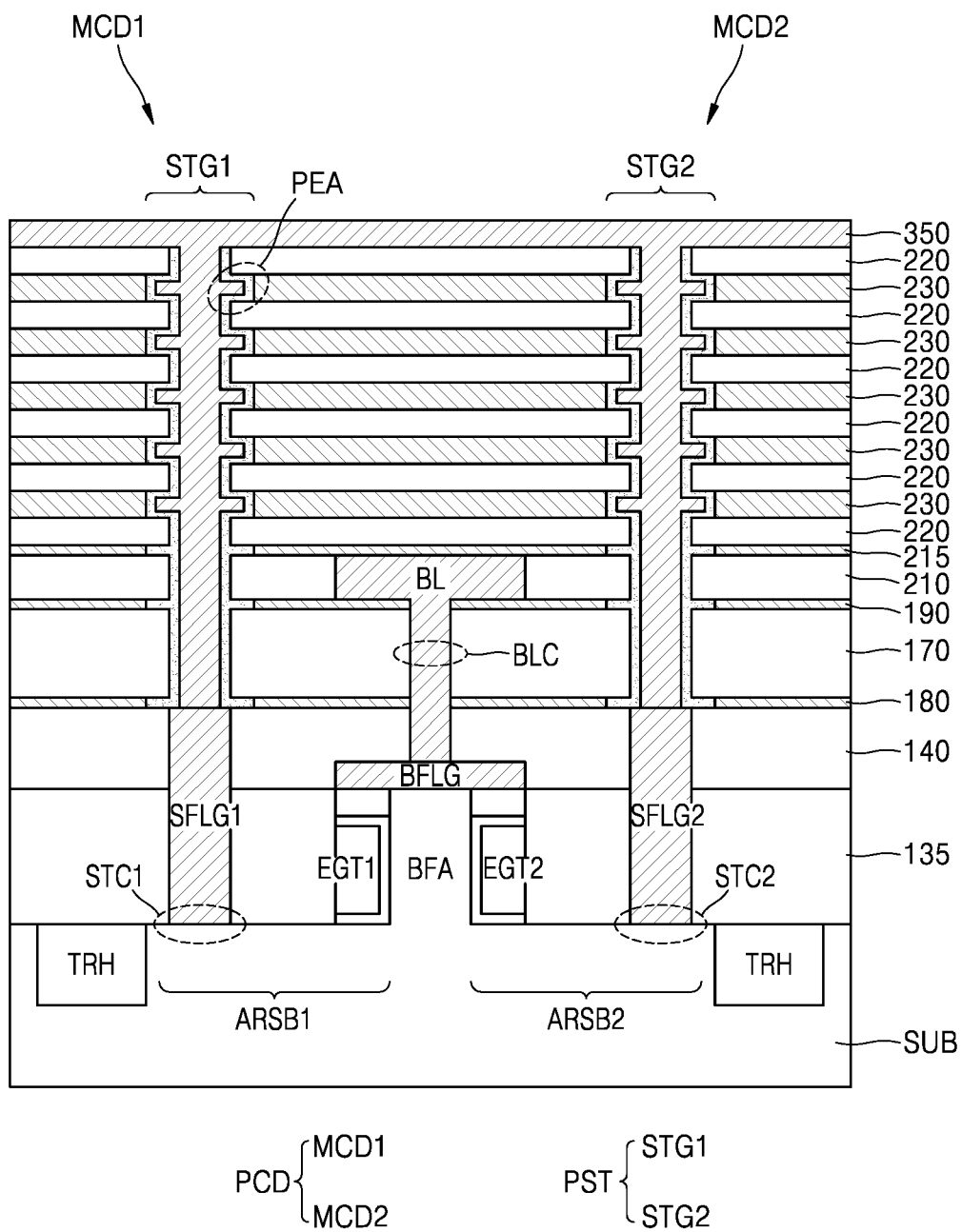
FIG. 3 is a cross-sectional view taken along a line A-A' of FIG. 1.

FIG. 1 is a layout diagram of a portion of a dynamic random access memory (DRAM) cell array according to an exemplary embodiment of the present invention. FIG. 2 is a perspective view of the DRAM cell array of FIG. 1, and for the sake of clarity, only some components are illustrated. FIG. 3 is a cross-sectional view taken along a line A-A' of FIG. 1.

Referring to FIGS. 1 to 3, a plurality of DRAM cell pairs may be arranged in a DRAM cell array according to the present invention. Each of the plurality of DRAM cell pairs PCD may include a first DRAM cell MCD1 and a second DRAM cell MCD2.

Further, the DRAM cell array of the present invention may include a facing bar BFA, first and second word lines WL1 and WL2, a plurality of bit line plugs BFLG, and pairs of storages PST.

The facing bar BFA may be formed to protrude with a predetermined width and height from a lateral surface of a semiconductor substrate SUB, and extend in a first direction (an X direction of FIG. 1 in the present embodiment) that is a lateral direction.

In addition, a plurality of active areas ARACT corresponding to the plurality of DRAM cell pairs PCD may be arranged in a row in the first direction. In this case, each of the plurality of active areas ARACT may be divided into a first sub-area ARSB1 and a second sub-area ARSB2 by the facing bar BFA.

In the present embodiment, the first DRAM cell MCD1 may be formed in the first sub-area ARSB1, and the second DRAM cell MCD2 may be formed in the second sub-area ARSB2.

The first and second word lines WL1 and WL2 may be formed on both side surfaces of the facing bar FBA. In this case, the first and second word lines WL1 and WL2 may be assigned to gate electrodes EGT1 and EGT2 of cell transistors of the first and second DRAM cells MCD1 and MCD2 of each of the plurality of DRAM cell pairs PCD.

Thus, the gate electrodes EGT1 and EGT2 of the cell transistors of the first and second DRAM cells MCD1 and MCD2 may be formed to contact both side surfaces of the facing bar BFA and the lateral surface of the semiconductor substrate.

In the DRAM cell array of the present invention, it should be noted that the first and second word lines WL1 and WL2 are formed without using a photolithography and etching processes.

The plurality of bit line plugs BFLG may be formed on the facing bar BFA to correspond to the plurality of DRAM cell pairs PCD. In this case, each of the plurality of bit line plugs BFLG may be shared by junctions of one sides of the cell transistors of the first and second DRAM cells MCD1 and MCD2 of the corresponding DRAM cell pair PCD.

For reference, in FIG. 2, the bit line plugs BFLG may be formed to have a width greater than a width of the facing bar BFA. Furthermore, the bit line plugs BFLG may be formed to extend over regions of the first and second word lines WL1 and WL2.

However, for the sake of clarity, widths of the bit line plugs BFLG are shown reduced in FIG. 2.

Further, in the present embodiment, bit line contact holes BLC may be formed on intersections between the facing bar BFA and the bit lines BL1 and BL2 to correspond to the intersections. The bit lines BL may extend in a second direction (a Y direction of FIG. 1 in the present embodiment), which is a lateral direction. For reference, in FIG. 2, only column portions of the bit lines BL connected to the bit line plugs BFLG are illustrated, and the illustration of interconnection portions of the bit lines BL that extend in the second direction is omitted.

In this case, the junctions of one sides of the cell transistors of the first and second DRAM cells MCD1 and MCD2 may be commonly connected to the bit line BL through the bit line plug BFLG.

The plurality of pairs of storages PST may be formed to correspond to the plurality of DRAM cell pairs PCD, and each of the pairs of storages PST may include first and second storages STG1 and STG2. In this case, the first and second storages STG1 and STG2 may be electrically connected to the first and second sub-areas ARSB1 and ARSB2 and, as a result, be electrically connected to junctions of the other sides of the cell transistors of the first and second DRAM cells MCD1 and MCD2.

In other words, the junctions of the other sides of the cell transistors of the first and second DRAM cells MCD1 and MCD2 may be electrically connected to the first and second storages STG1 and STG2 through first and second storage plugs SFLG1 and SFLG2 formed by filling storage contact holes STC1 and STC2, respectively.

Meanwhile, in the DRAM cell array of the present invention, each of the first and second storages STG1 and STG2 of one pair of first and second DRAM cells MCD1 and MCD2 may be formed as a multi-fin type having a plurality of lateral protrusions PEA.

Figure 4:
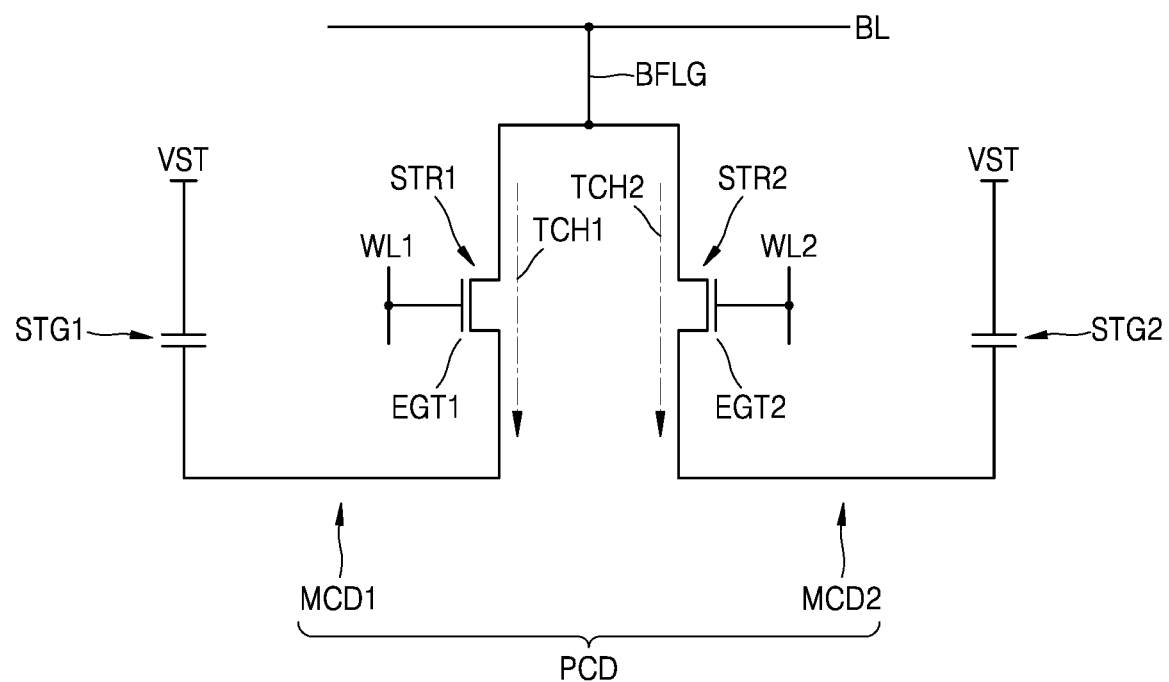
FIG. 4 is a diagram of an equivalent circuit of a DRAM cell pair of the DRAM cell array of FIG. 3.

FIG. 4 is a diagram of an equivalent circuit of one DRAM cell pair PCD of the DRAM cell array of FIG. 3. Referring to FIGS. 3 and 4, the first DRAM cell MCD1 of the DRAM cell pair PCD may include one cell transistor STR1 and one storage STG1, and the second DRAM cell MCD2 of the DRAM cell pair PCD may include one cell transistor STR2 and one storage STG2.

In this case, junctions of one sides of the cell transistors STR1 and STR2 may be electrically connected to a bit line BL through a common bit line plug BFLG, and junctions of the other sides of the cell transistors STR1 and STR2 may be connected to one sides of the respective storages STG1 and STG2. For reference, a storage voltage VST may be applied to the other sides of the storages STG1 and STG2. In this case, the storage voltage VST may be a ground voltage.

Further, transmission channels TCH1 and TCH2, which may connect the bit line BL with the respective storages STG1 and STG2, may be respectively formed due to voltages (i.e., voltages of word lines WL1 and WL2) applied to gate electrodes EGT1 and EGT2 of the cell transistors STR1 and STR2.

In this case, each of the transmission channels TCH1 and TCH2 may be formed to include a vertical-directional component and a lateral-directional component.

Further, the vertical-directional component of each of the transmission channels TCH1 and TCH2 may be formed on a side surface of the facing bar BFA. That is, the vertical-directional components of the transmission channels TCH1 and TCH2 of the one pair of first and second DRAM cells MCD1 and MCD2 may be formed on both sides of the facing bar BFA to face each other.

According to the above-described DRAM cell array of the present invention, the facing far BFA and the bit line plug BFLG may be shared by one pair of first and second DRAM cells MCD1 and MCD2.

That is, the transmission channels TCH1 and TCH2 may be formed such that the cell transistors STR1 and STR2 of the one pair of first and second DRAM cells MCD1 and MCD2 face each other on both sides of the facing bar BFA. Further, the one pair of first and second DRAM cells MCD1 and MCD2 may be connected to the bit line BL through the common bit line plug BFLG.

In other words, portions of the transmission channels TCH1 and TCH2 of the one pair of first and second DRAM cells MCD1 and MCD2 may be formed on both sides of the facing bar BFA and commonly connected to the bit line BL through the bit line plug BFLG. In this case, other portions of the transmission channels TCH1 and TCH2 of the one pair of first and second DRAM cells MCD1 and MCD2 may be formed on a lateral surface of the semi conductor substrate.

Thus, according to the above-described DRAM cell array of the present invention, a required layout area may be greatly reduced.

A method of fabricating a DRAM cell array of the present invention will be now described.

Figure 5:
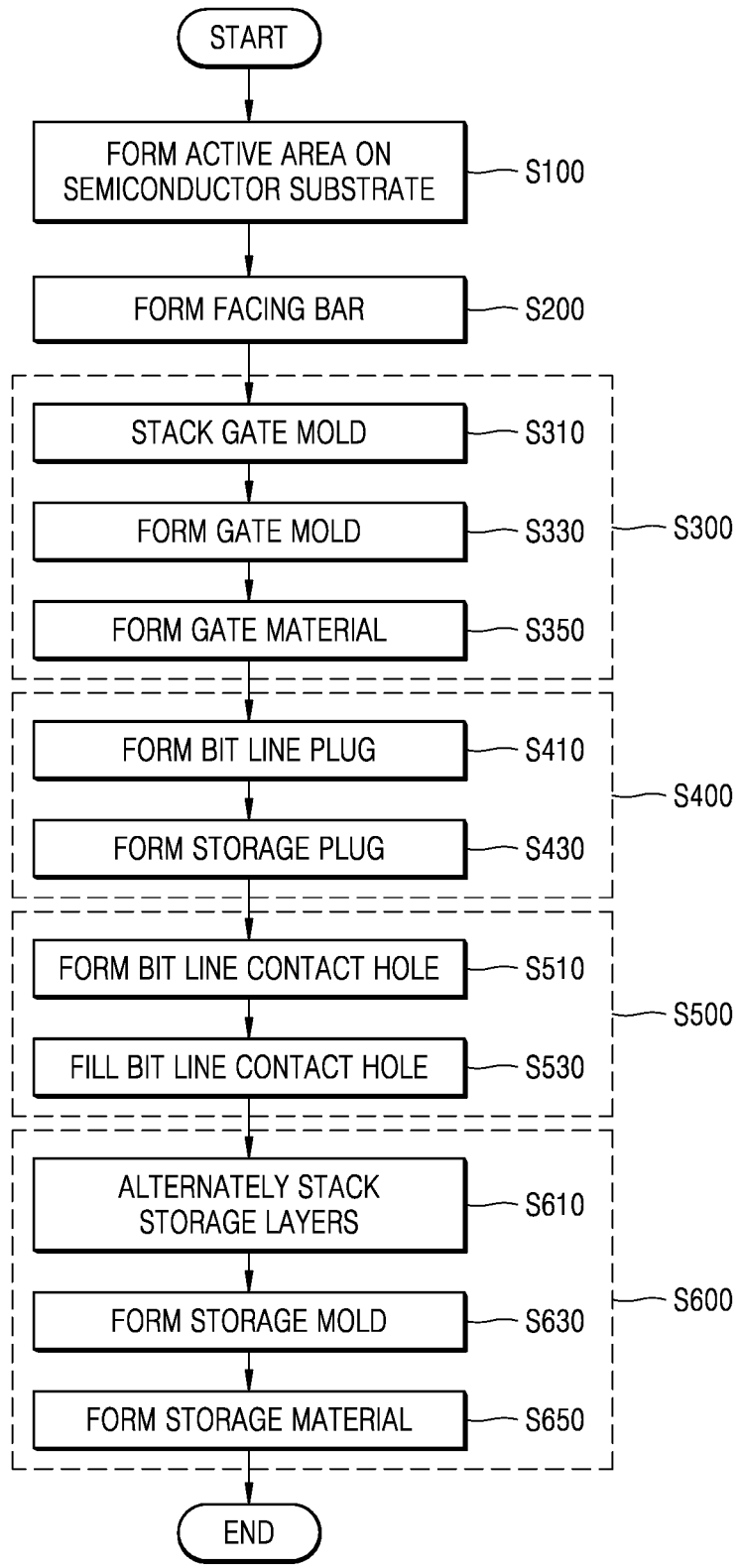
FIG. 5 is a flowchart of a method of fabricating a DRAM cell array according to an exemplary embodiment of the present invention.

FIG. 5 is a flowchart of a method of fabricating a DRAM cell array according to the present invention. Further, FIGS. 6A to 6L are cross-sectional views of each operation of the method of fabricating the DRAM cell array of FIG. 5.

Furthermore, in FIGS. 6A to 6L, for the sake of clarity, reference numerals not including '< >' for respective elements are illustrated and described. Further, in the present specification, the illustration and description of an element configured to insulate respective constituent materials and reduce stress between components may be omitted. In addition, the illustration and description of impurities intentionally introduced in each operation and an impurity layer formed thereby may also be omitted.

Referring to FIG. 5, the method of fabricating the DRAM cell array according to the present invention may include an active forming operation S100, a facing bar forming operation S200, a gate electrode forming operation S300, a plug forming operation S400, a bit line forming operation S500, and a storage forming operation S600.

Figure 6A:
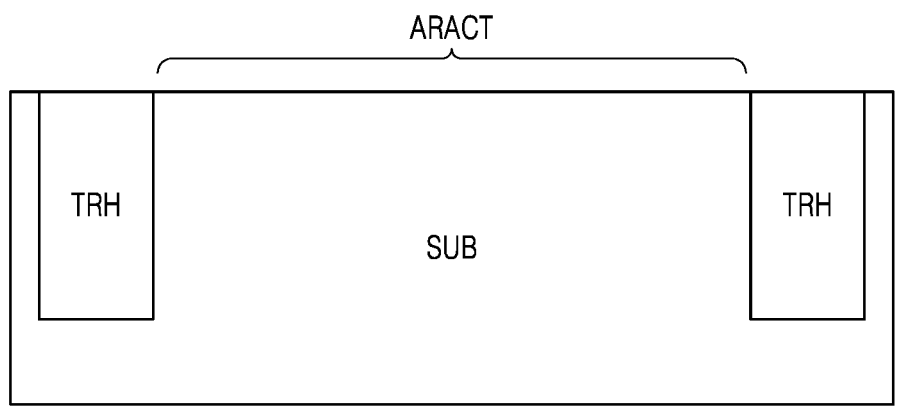
FIGS. 6A to 6L are cross-sectional views of each operation of a method of fabricating the DRAM cell array of FIG. 5.

In the active forming operation S100, as shown in FIG. 6A, a plurality of active areas ARACT may be formed. In this case, the plurality of active areas ARACT may be arranged in a row in a first direction as described above. For reference, in FIGS. 6A to 6L, for the sake of clarity, one active area ARACT is illustrated.

The active forming operation S100 will now be described in further detail. To begin, a substrate insulating film (not shown) may be stacked and formed on a semiconductor substrate SUB on which a substrate oxide film (not shown) is formed. In this case, the substrate insulating film (not shown) may be formed of a nitride film (SiN) and the like.

Further, an isolation trench TRH may be formed in the semiconductor substrate SUB on which the substrate insulating film (not shown) is formed. In this case, an operation of forming the isolation trench TRH may be performed using a photomask configured to mask the active area ARACT. Since the operation of forming the isolation trench is obvious to one skilled in the art, detailed descriptions thereof are omitted.

Thereafter, the isolation trench TRH may be filled with an insulating material (e.g., an oxide layer) to obtain the active area ARACT.

Figure 6B:
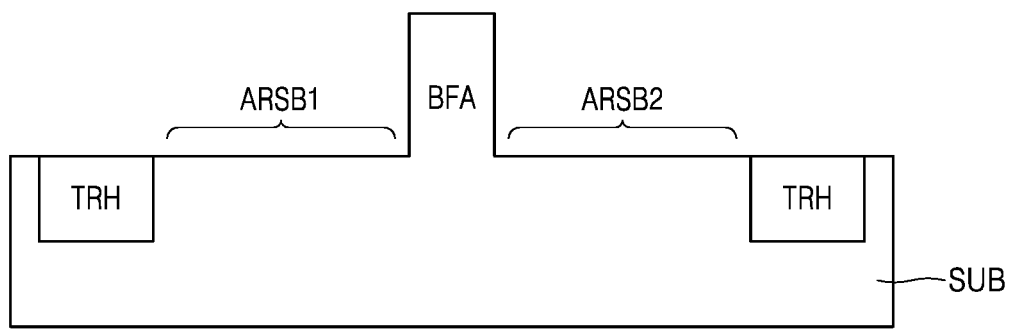

In the facing bar forming operation S200, the semiconductor substrate SUB having the isolation trench TRH that is filled with the insulating material may be etched. Thus, as shown in FIG. 6B, a facing bar BFA may be formed.

By performing the facing bar forming operation S200, the facing bar BFA may be formed to have a predetermined width and height with respect to a lateral surface of the semiconductor substrate SUB and extend in a first direction. In this case, the active area ARACT may be divided into first and second sub-areas ARSB1 and ARSB2 by the facing bar BFA.

The operation of forming the facing bar BFA may be performed using a photomask configured to mask a region of the facing bar BFA.

Furthermore, although not shown, channel impurities for forming junctions and transmission channels of transistors to be subsequently formed may be implanted into the facing bar BFA and the lateral surface of the semiconductor substrate SUB.

By implanting the channel impurities or the like, junctions of one sides of the cell transistors STR1 and STR2 may be commonly connected to a bit line BL through a bit line plug BLFG, and junctions of the other sides of the cell transistors STR1 and STR2 may be electrically connected to storages STG1 and STG2 through storage plugs SFLG1 and SFLG2 (see FIG. 3).

In the gate forming operation S300, first and second word lines WL1 and WL2 (see FIGS. 1 and 2) may be formed on both side surfaces of the facing bar BFA. In this case, as described above, the first and second word lines WL1 and WL2 may be assigned to gate electrodes EGT1 and EGT2 of cell transistors STR of first and second DRAM cells MCD1 and MCD2 of each of the plurality of DRAM cell pairs PCD.

Specifically, the gate forming operation S300 may include a gate mold stacking process S310, a gate mold forming process S330, and a gate material forming process S350.

Figure 6C:
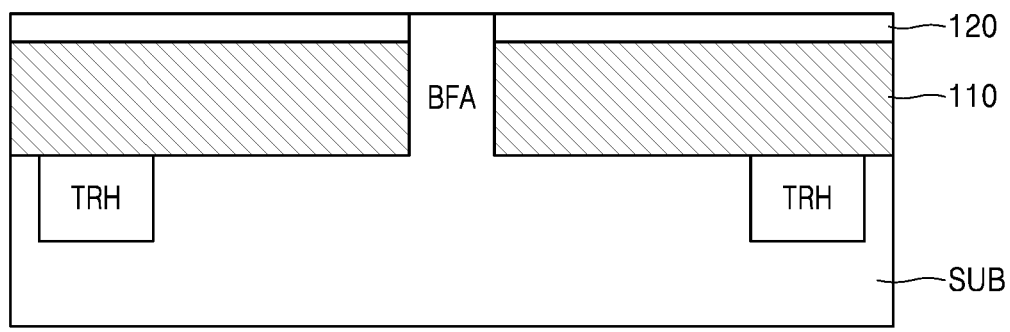

In the gate mold stacking process S310, as shown in FIG. 6C, a gate auxiliary material layer 110 and a gate mold layer 120 may be sequentially stacked to contact both side surfaces of the facing bar BFA. In this case, a silicon nitride film may be used as the gate auxiliary material layer 110, and a silicon oxide film may be used as the gate mold layer 120.

In the gate mold forming process S330, portions of the gate mold layer 120 and the gate auxiliary material layer 110 of FIG. 6C may be etched to obtain a space region, and the gate auxiliary material layer 110 may then be removed using an etching operation. As a result, in the gate mold forming process S330, as shown in FIG. 6D, the gate mold layer 120 may remain to form a gate mold GMD in contact with both side surfaces of the facing bar BFA.

Figure 6D:
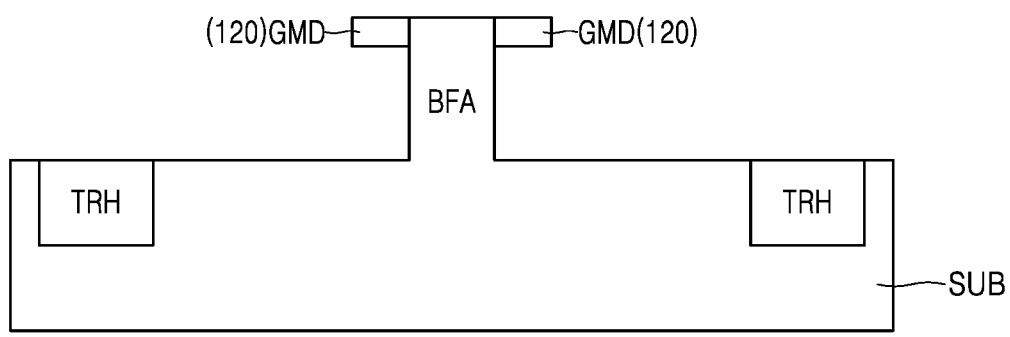

In the gate material forming process S350, to begin, a channel oxide film 125 and a gate material 130 may be sequentially deposited on both side surfaces of the facing bar BFA on which the gate mold GMD of FIG. 6D is formed. In this case, the channel oxide film 125 may be formed of a thin silicon oxide film, and the gate material 130 may be formed of a highly conductive material such as doped polysilicon (poly-Si), tungsten (W), titanium (Ti), and the like.

Further, the channel oxide film 125 and the gate material 130 may be etched using the gate mold GMD as a stopper.

Figure 6E:
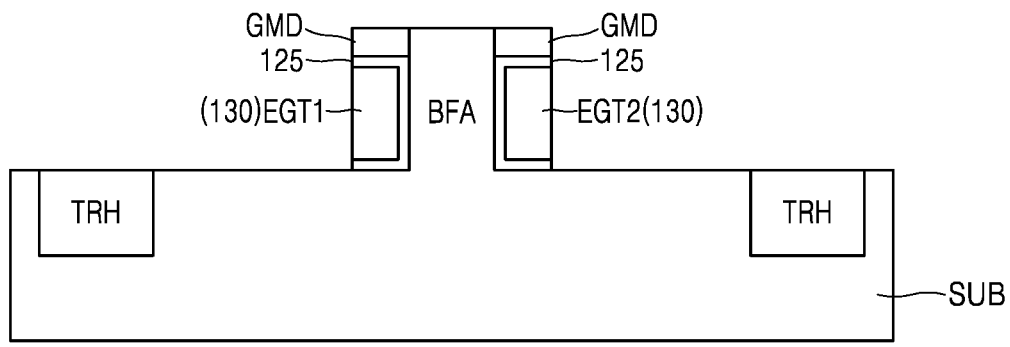

As a result of the gate material forming process S350, as shown in FIG. 6E, the gate electrodes EGT1 and EGT2 of the first and second DRAM cells MCD1 and MCD2 may be formed. In this case, the gate electrodes EGT1 and EGT2 may be in contact with side surfaces of the facing bar BFA and a lateral surface of the semiconductor substrate SUB.

Meanwhile, the gate electrodes EGT1 and EGT2 may be wholly or partially silicided. The silicided gate electrodes EGT may have a greatly reduced sheet resistance and high conductivity. Since a technique of siliciding the gate electrodes EGT1 and EGT2 is obvious to one skilled in the art, detailed descriptions thereof are omitted herein.

Further, the gate electrodes EGT1 and EGT2 may be wholly or partially formed of a metal, such as tungsten (W) or titanium (Ti). In this case, the gate electrodes EGT1 and EGT2 may have high conductivity.

In addition, since a process of wholly or partially forming the gate electrodes EGT1 and EGT2 using a metal is obvious to one skilled in the art, detailed descriptions thereof are omitted herein.

Furthermore, although not shown, after the gate forming operation S300 is performed, channel impurities (not shown) may be implanted.

Afterwards, the plug forming operation S400 may be performed.

In the plug forming operation S400, the corresponding bit line plug BFLG (see FIG. 3) may be formed on the facing bar FBR of each of the plurality of active areas ARACT. Further, in the plug forming operation S400, first and second storage plugs SFLG1 and SFLG2 may be formed in the first and second sub-areas ARSB1 and ARSB2 of each of the plurality of active areas ARACT.

Here, the bit line plug BFLG may be shared by junctions of one sides of the cell transistors STR1 and STR2 of the respective first and second DRAM cells MCD1 and MCD2 of the corresponding DRAM cell pair PCD. As described above, the first and second storage plugs SFLG1 and SFLG2 may be electrically connected to junctions of the other sides of the cell transistors STR1 and STR2 of the respective first and second DRAM cells MCD1 and MCD2 of the corresponding DRAM cell pair PCD.

The plug forming operation S400 may include a bit line plug forming process S410 and a storage plug forming process S430.

In the bit line plug forming process S410, to begin, an interlayer insulating film 135 may be formed on the semiconductor substrate SUB on which the gate electrode EGT of FIG. 6E is formed. In this case, the interlayer insulating film 135 may be a silicon oxide layer.

Figure 6F:
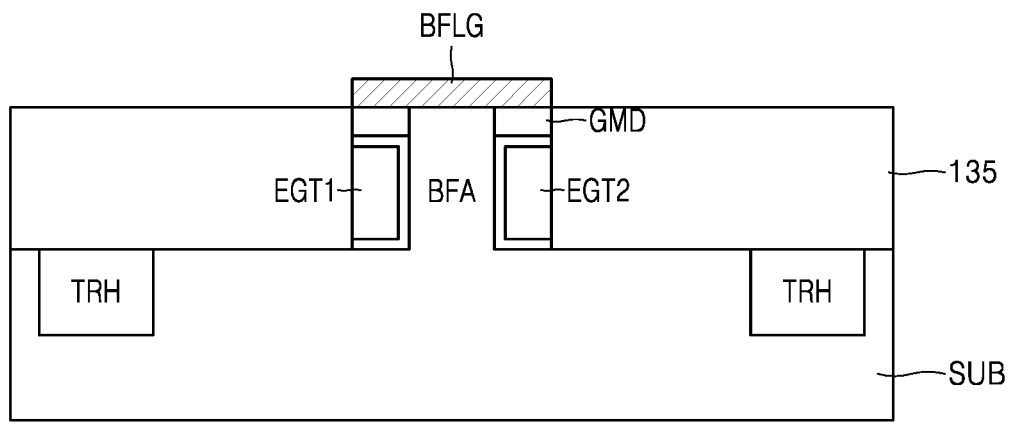

Further, a portion of the interlayer insulating film 135 may be etched and removed to expose an upper portion of the facing bar BFA. In this case, the upper portion of the facing bar BFA may also be partially etched. In addition, a conductive material (e.g., a metal, tungsten, poly-Si, and single-crystalline silicon) may be formed on the exposed upper portion of the facing bar BFA. As a result, as shown in FIG. 6F, the bit line plug BFLG may be formed to contact the upper portion of the facing bar BFA.

After the bit line plug forming process S410, junction impurities (not shown) may be implanted to form one junction of a transmission channel TCH.

Meanwhile, the bit line plug BFLG formed in the bit line plug forming process S410 may be disposed on the facing bar BFA. Therefore, according to the method of fabricating the DRAM cell array of the present invention, in each of the formed DRAM cells MCD1 and MCD2, a gap for electrical insulation may not be required between the bit line plug BFLG and the gate electrode EGT. As a result, according to the present invention, a required area of the DRAM cell, further, a required area of the DRAM cell array may be further reduced.

In the storage plug forming process S430, after a storage protective layer 140 that is an insulating layer is deposited, the storage protective layer 140 and the interlayer insulating film 135 may be etched to expose the first and second sub-areas ARSB1 and ARSB2, thereby forming a storage contact hole SCTH. In this case, the storage protective layer 140 may be a silicon oxide layer, and the etching of the storage protective layer 140 may be performed using a photomask. Further, the storage contact hole SCTH may be filled with a conductive material (e.g., a metal, tungsten, poly-Si, and single-crystalline silicon).

Figure 6G:
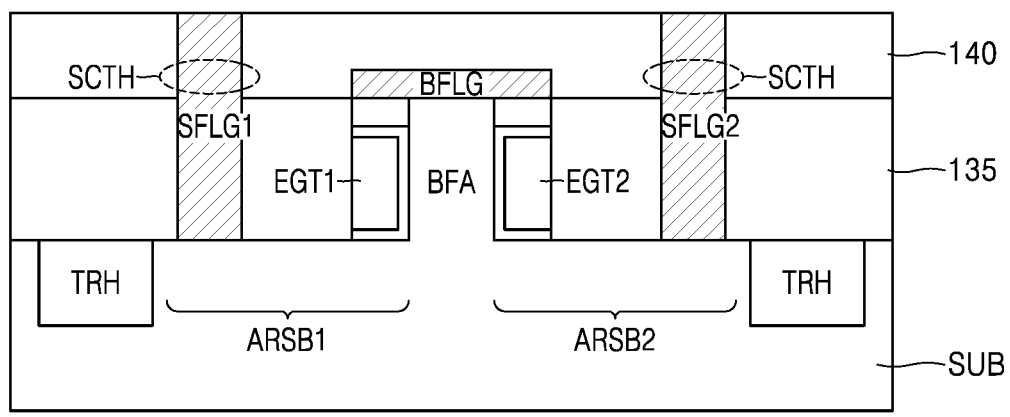

Subsequently, a planarization operation may be performed, and the resultant structure may be coated with a storage nitride film (not shown) to form the storage plugs SFLG as shown in FIG. 6G.

The storage plugs SFLG1 and SFLG2 formed in the storage plug forming process S430 may be electrically connected to the other sides of the transmission channels TCH of the cell transistors STR1 and STR2.

In the bit line forming operation S500, the bit line BL may be formed to be electrically connected to the bit line plug BFLG In this case, as described above, the bit line BL may extend in a second direction intersecting the first direction.

Specifically, the bit line forming operation S500 may include a bit line contact hole forming process S510 and a bit line filling process S530.

Figure 6H:
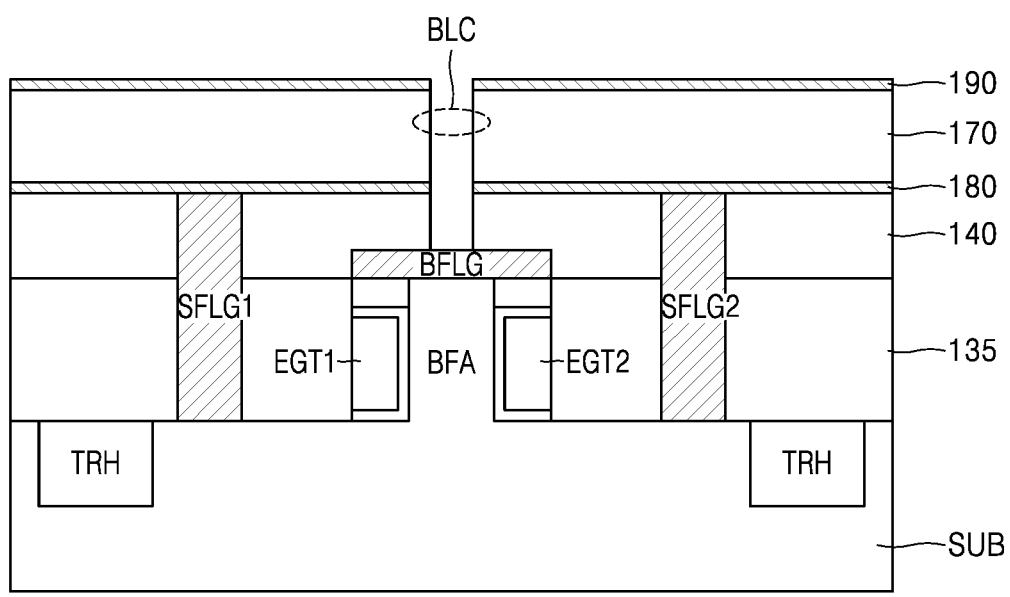

In the bit line contact hole forming process S510, as shown in FIG. 6H, to begin, a bit line protective layer 170 may be formed on the bit line plug BFLG In this case, the bit line protective layer 170 may be formed of a silicon oxide layer, and silicon nitride layers 180 and 190 configured to reduce stress may be formed directly on and under the bit line protective layer 170.

Subsequently, the bit line protective layer 170 may be etched to expose at least a portion of the bit line plug BFLG, thereby forming a bit line contact hole BLC.

Figure 6I:
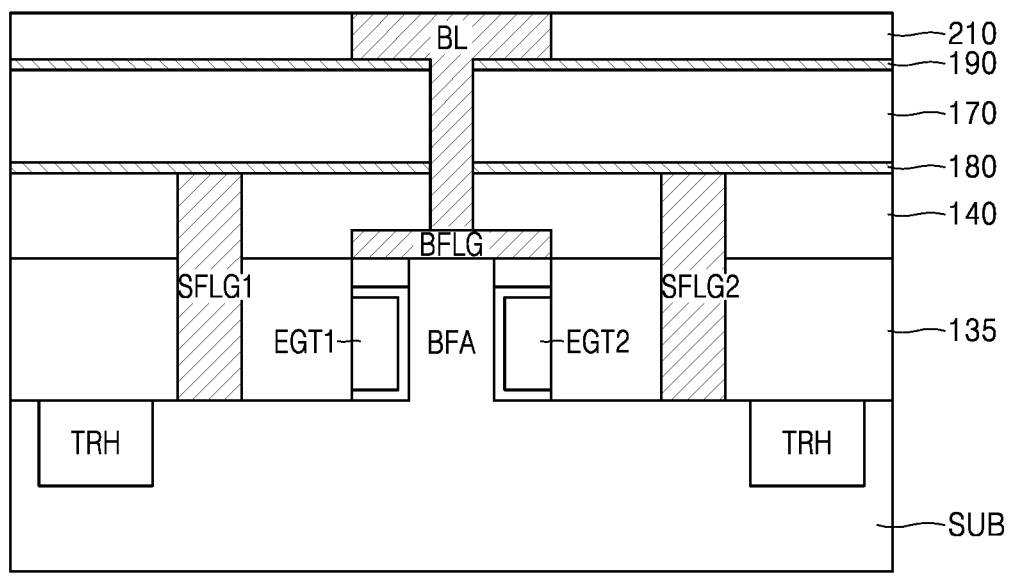

In the bit line filling process S530, as shown in FIG. 6I, the bit line contact hole BLC may be filled with a conductive material and patterned to form a bit line BL. Thereafter, the resultant structure may be coated with a plug protective layer 210, and a planarization operation may be performed. In this case, the plug protective layer 210 may be a silicon oxide layer.

In the storage forming operation S600, first and second storages STG1 and STG2 may be formed to respectively correspond to the first and second sub-areas ARSB1 and ARSB2. In this case, the first and second storages STG1 and STG2 may be electrically connected to junctions of the other sides of the cell transistors STR of the corresponding first and second DRAM cells MCD1 and MCD2 through the corresponding first and second storage plugs SFLG1 and SFLG2, and store charges.

Specifically, the storage forming operation S600 may include a storage alternate-stacking process S610, a storage mold forming process S630, and a storage material forming process S650.

Figure 6J:
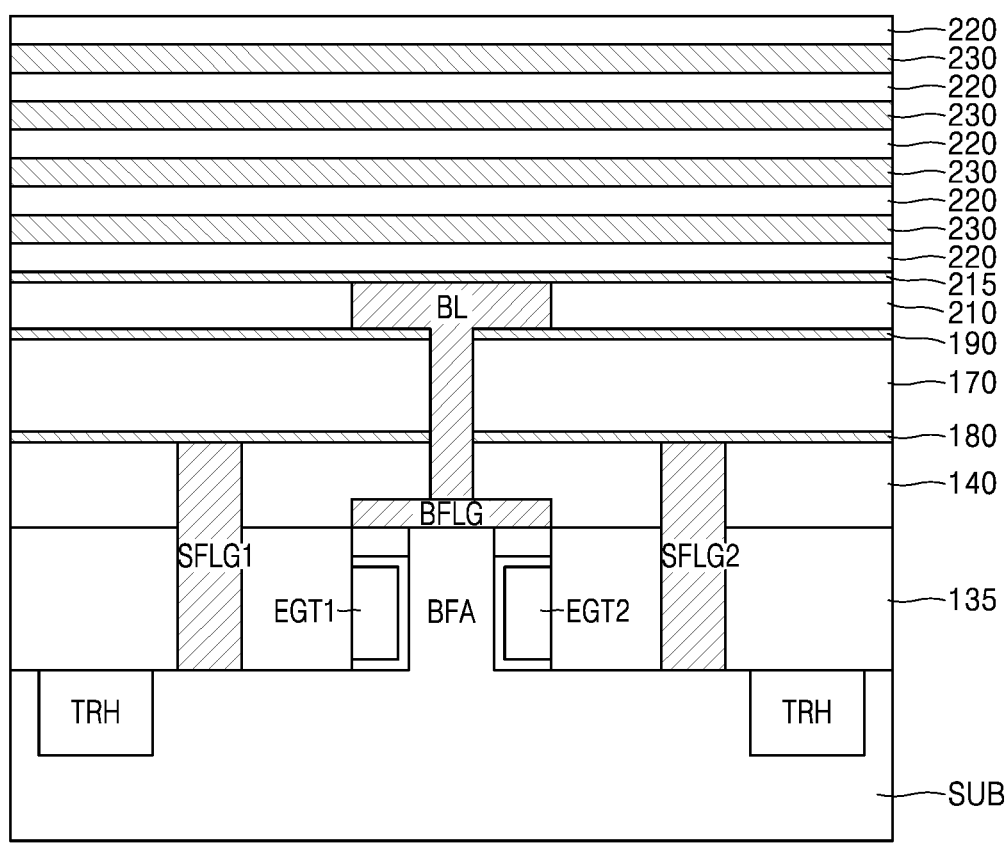

In the storage alternate-stacking process S610, as shown in FIG. 6J, a plurality of storage mold layers 220 and a plurality of storage auxiliary material layers 230 may be alternately stacked on the storage plug SFLG. In this case, a silicon oxide film may be used as the storage mold layer 220, and a silicon nitride film may be used as the storage auxiliary material layer 230.

For reference, a silicon nitride film may be used as a material layer 215 configured to reduce stress between the bit line BL and the storage mold layers 220.

Figure 6K:
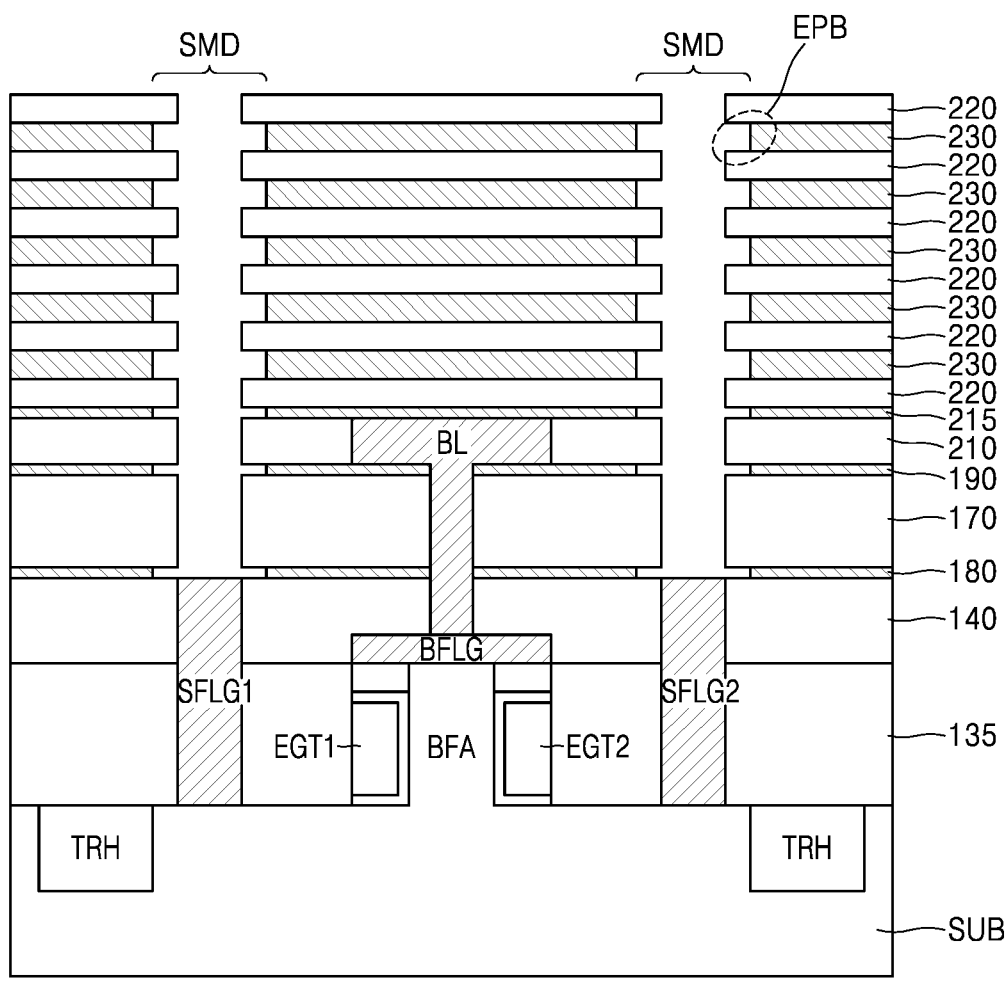

In the storage mold forming process S630, as shown in FIG. 6K, the plurality of storage mold layers 220 and the plurality of storage auxiliary material layers 230, which are stacked, may be etched to expose the storage plugs SFLG, and further etched to pull back a portion of each of the storage auxiliary material layers 230 (refer to EPB). In this case, the bit line protective layer 170, the silicon nitride layer 180, 190, the plug protective layer 210, and the like may be etched together. As a result, storage molds SMD may be formed.

Figure 6L:
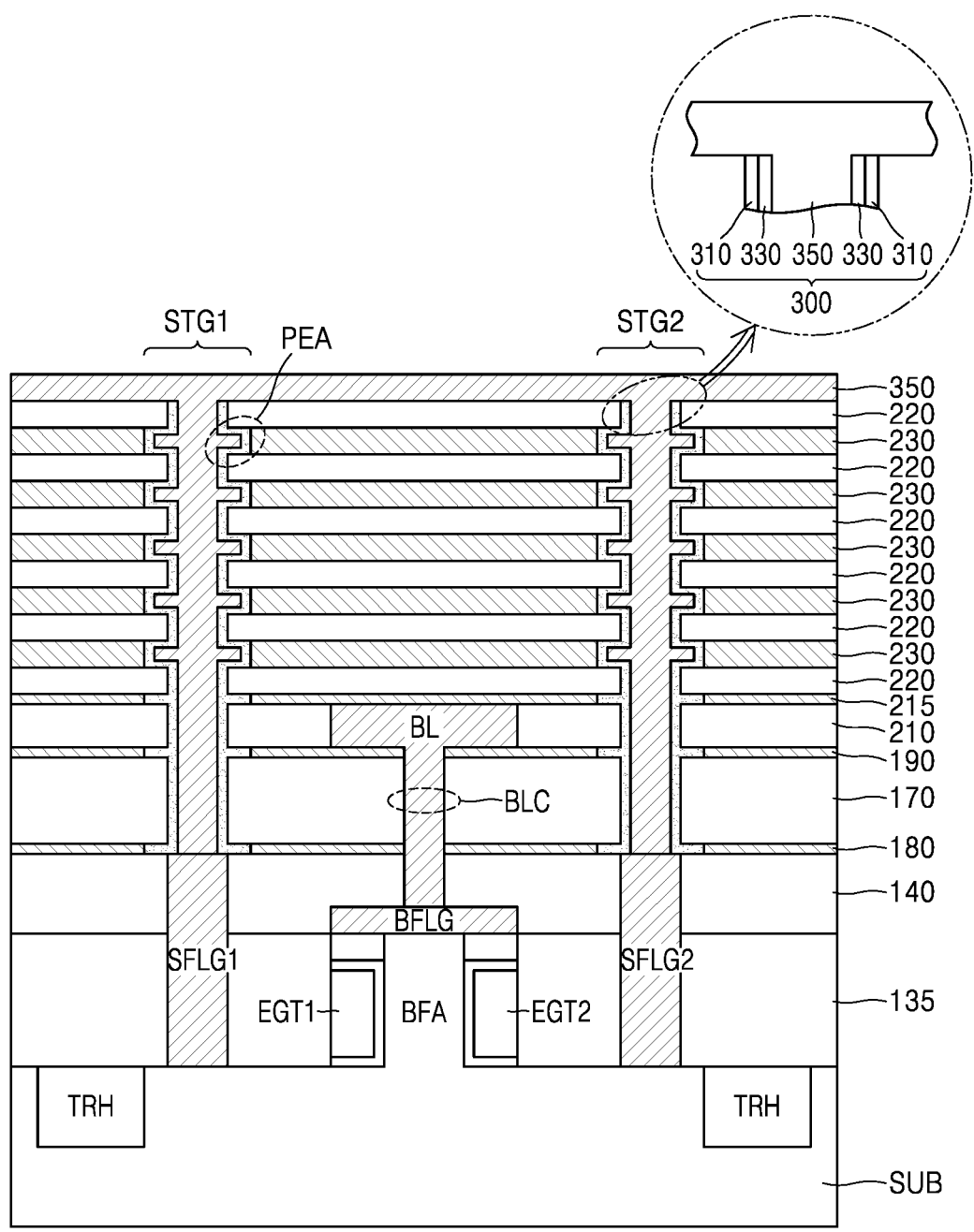

Furthermore, in the storage material forming process S650, as shown in FIG. 6L, a storage material 300 may be deposited on side surfaces of the storage mold SMD. That is, the storage material 300 may be deposited on side surfaces of the storage mold layers 220 and the storage auxiliary material layers 230, which are exposed through the storage mold forming process S630.

In this case, the formation of the storage material 300 may include sequentially depositing a first electrode material 310 that is a conductive material and a dielectric material 330 on the side surfaces of the storage mold SMD, and then filling with a second electrode material 350 that is a conductive material. Thus, the storages STG1 and STG2 capable of storing charges may be formed. Each of the storages STG1 and STG2 may be formed as a multi-fin type having a plurality of lateral protrusions PEA. Accordingly, a layout area of the DRAM cell array may be minimized, while the storage STG may have an increased area and a high storage capacity.

In a DRAM cell array fabricated according to a method of fabricating a DRAM cell array of the present invention as described above, a first DRAM cell and a second DRAM cell of each of DRAM cell pairs can share a facing bar and a bit line plug therebetween. Therefore, according to the DRAM cell array fabricated using the method of fabricating the DRAM cell array of the present invention, the overall layout area can be greatly reduced.

Further, in a method of fabricating a DRAM cell array according to an exemplary embodiment of the present invention, each of storages of DRAM cells of the DRAM cell array can be formed as a multi-fin type having a plurality of lateral protrusions, thereby greatly increasing an area of the storages.

What is claimed is:
1. A method of fabricating a dynamic random access memory (DRAM) cell array in which a plurality of DRAM cell pairs are arranged, each of the plurality of DRAM cell pairs comprising first and second DRAM cells, the method comprising:

forming a plurality of active areas on a semiconductor substrate to be arranged in a row in a first direction, wherein a corresponding DRAM cell pair is disposed in each of the plurality of active areas;

etching the semiconductor substrate, on which the plurality of active areas are formed, to form facing bars, wherein each of the facing bars extends in the first direction with a predetermined width and height on the semiconductor substrate, and divides each of the plurality of active areas into a first sub-area and a second sub-area;

forming a first word line and a second word line on both lateral surfaces of each of the facing bars and assigning the first and second word lines to gate electrodes of cell transistors of first and second DRAM cells of each of the plurality of DRAM cell pairs to form the gate electrodes, wherein the cell transistors of the first and second DRAM cells of each of the plurality of DRAM cell pairs have transmission channels formed on a lateral surface of the semiconductor substrate and the side surfaces of each of the facing bars;

forming bit line plugs on the facing bars corresponding to the plurality of active areas and forming first and second storage plugs on the first and second sub-areas of each of the plurality of active areas, wherein each of the bit line plugs is commonly connected to junctions of one sides of the respective cell transistors of the first and second DRAM cells of the corresponding DRAM cell pair, and the first and second storage plugs are electrically connected to junctions of the other sides of the respective cell transistors of the first and second DRAM cells of the corresponding DRAM cell pair;

forming a bit line to be electrically connected to the corresponding bit line plug, wherein the bit line extends in a second direction intersecting the first direction; and forming first and second storages to correspond to the first and second sub-areas, wherein the first and second storages are electrically connected to junctions of the other sides of the cell transistors of the corresponding first and second DRAM cells through the first and second storage plugs, wherein the forming of the gate electrodes comprises:
stacking a gate auxiliary material layer and a gate mold layer in contact with both of the side surfaces of the facing bar;
etching portions of the gate mold layer and the gate auxiliary material layer and removing the gate auxiliary material layer to form a gate mold in contact with both of the side surfaces of the facing bar; and
depositing a gate material on both of the side surfaces of the facing bar on which the gate mold is formed, and etching the gate material deposited on both of the side surfaces of the facing bar using the gate mold as a mask, to form the gate electrodes of the cell transistors of the first and second DRAM cells.

2. The method of claim 1, wherein the forming of the bit line plugs comprises:
forming an interlayer insulating film on the semiconductor substrate on which the gate electrodes of the cell transistors of the first and second DRAM cells are formed, and removing portions of the interlayer insulating film to expose upper portions of the facing bars to form the bit line plugs in contact with the upper portions of the facing bars; and
depositing a storage protective layer on the first sub-area and the second sub-area, etching the storage protective layer to expose the first and second sub-areas to form storage contact holes, and filling the storage contact holes with a storage plug material to form the first and second storage plugs.

3. The method of claim 1, wherein the forming of the bit line comprises:
forming a bit line protective layer on the bit line plugs and etching the bit line protective layer until at least portions of the bit line plugs are exposed, to form bit line contact holes; and
filling the bit line contact holes with a bit line material and performing a patterning process to form the bit lines.

4. A method of fabricating a dynamic random access memory (DRAM) cell array in which a plurality of DRAM cell pairs are arranged, each of the plurality of DRAM cell pairs comprising first and second DRAM cells, the method comprising:
forming a plurality of active areas on a semiconductor substrate to be arranged in a row in a first direction, wherein a corresponding DRAM cell pair is disposed in each of the plurality of active areas;
etching the semiconductor substrate, on which the plurality of active areas are formed, to form facing bars, wherein each of the facing bars extends in the first direction with a predetermined width and height on the semiconductor substrate, and divides each of the plurality of active areas into a first sub-area and a second sub-area;
forming a first word line and a second word line on both lateral surfaces of each of the facing bars and assigning the first and second word lines to gate electrodes of cell transistors of first and second DRAM cells of each of the plurality of DRAM cell pairs to form the gate electrodes, wherein the cell transistors of the first and second DRAM cells of each of the plurality of DRAM cell pairs have transmission channels formed on a lateral surface of the semiconductor substrate and the side surfaces of each of the facing bars;
forming bit line plugs on the facing bars corresponding to the plurality of active areas and forming first and second storage plugs on the first and second sub-areas of each of the plurality of active areas, wherein each of the bit line plugs is commonly connected to junctions of one sides of the respective cell transistors of the first and second DRAM cells of the corresponding DRAM cell pair, and the first and second storage plugs are electrically connected to junctions of the other sides of the respective cell transistors of the first and second DRAM cells of the corresponding DRAM cell pair;
forming a bit line to be electrically connected to the corresponding bit line plug, wherein the bit line extends in a second direction intersecting the first direction; and
forming first and second storages to correspond to the first and second sub-areas, wherein the first and second storages are electrically connected to junctions of the other sides of the cell transistors of the corresponding first and second DRAM cells through the first and second storage plugs,
wherein the forming of the first and second storages comprises:
alternately stacking a plurality of storage auxiliary material layers and a plurality of storage mold layers on the first and second storage plugs;
etching the stacked plurality of storage auxiliary material layers and plurality of storage mold layers to expose the first and second storage plugs, and performing a an additional etching process until a portion of each of the storage auxiliary material layers is pulled back, to form a storage mold; and
depositing a storage material on side surfaces of the storage mold to form the first and second storages, wherein each of the first and second storages is formed as a multi-fin type having a plurality of lateral protrusions.

* * * * *